United States Patent
Vogt

(10) Patent No.: US 10,432,154 B2
(45) Date of Patent: Oct. 1, 2019

(54) REGULATION OF AN RF AMPLIFIER

(71) Applicant: STMicroelectronics SA, Montrouge (FR)

(72) Inventor: Lionel Vogt, La Rochette (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/609,639

(22) Filed: May 31, 2017

(65) Prior Publication Data

US 2018/0152155 A1 May 31, 2018

(30) Foreign Application Priority Data

Nov. 29, 2016 (FR) ...................................... 16 61610

(51) Int. Cl.
| | |
|---|---|
| *H03G 3/10* | (2006.01) |
| *H03F 3/42* | (2006.01) |
| *H03F 1/02* | (2006.01) |
| *H03F 1/30* | (2006.01) |
| *H03F 3/189* | (2006.01) |
| *H03F 3/193* | (2006.01) |
| *H03G 3/30* | (2006.01) |

(52) U.S. Cl.
CPC ........... *H03F 3/423* (2013.01); *H03F 1/0272* (2013.01); *H03F 1/30* (2013.01); *H03F 1/301* (2013.01); *H03F 3/189* (2013.01); *H03F 3/193* (2013.01); *H03G 3/30* (2013.01); *H03G 3/3015* (2013.01); *H03G 3/3036* (2013.01); *H03G 3/3047* (2013.01); *H03F 2200/15* (2013.01); *H03F 2200/18* (2013.01); *H03F 2200/447* (2013.01); *H03F 2200/451* (2013.01); *H03F 2200/78* (2013.01)

(58) Field of Classification Search
CPC ..... H03F 1/0272; H03F 3/195; H03F 2200/91
USPC .................................. 330/285, 277, 296, 311
See application file for complete search history.

(56) References Cited

U.S. PATENT DOCUMENTS

| | | | |
|---|---|---|---|
| 5,493,255 A | 2/1996 | Murtojarvi | |
| 7,348,854 B1 * | 3/2008 | Mordkovich | ........... H03F 1/301 330/285 |
| 7,515,000 B1 * | 4/2009 | Jin | ............. H03F 1/26 330/279 |
| 8,502,606 B2 * | 8/2013 | Kim | ...... H03F 1/0272 330/285 |
| 8,816,774 B2 * | 8/2014 | Shinichi | .................. H03F 1/223 330/285 |

(Continued)

FOREIGN PATENT DOCUMENTS

JP 2005123861 A 5/2005

*Primary Examiner* — Khanh V Nguyen
*Assistant Examiner* — Khiem D Nguyen
(74) *Attorney, Agent, or Firm* — Slater Matsil, LLP

(57) ABSTRACT

A radiofrequency (RF) amplifier includes an input terminal, an output terminal, and a power supply and biasing stage having an output coupled to the input terminal. An amplification stage of the RF amplifier includes a first transistor having a control terminal coupled to the input terminal and a first conduction terminal coupled to the output terminal. The power supply and biasing stage is configured to generate a bias voltage at the control terminal of the first transistor to simultaneously regulate a power supply voltage of the amplification stage to a first voltage and a bias current of the amplification stage to a first current.

22 Claims, 4 Drawing Sheets

(56) References Cited

U.S. PATENT DOCUMENTS

| | | |
|---|---|---|
| 2004/0164803 A1 | 8/2004 | Canyon et al. |
| 2009/0206933 A1 | 8/2009 | Prikhodko et al. |
| 2010/0156539 A1 | 6/2010 | Ha et al. |
| 2013/0049872 A1 | 2/2013 | Shinichi et al. |
| 2013/0076445 A1 | 3/2013 | Kim et al. |

* cited by examiner

REGULATION OF AN RF AMPLIFIER

CROSS-REFERENCE TO RELATED APPLICATIONS

This application claims priority to French Patent Application No. 1661610, filed on Nov. 29, 2016, which application is hereby incorporated herein by reference.

TECHNICAL FIELD

The present description generally relates to electronic circuits and, more particularly, the regulation of the power supply and biasing of a radiofrequency (RF) amplifier.

BACKGROUND

Radiofrequency amplifiers are used in numerous applications in order to amplify various digital and analogue signals. In particular, such amplifiers are used at very high frequencies in applications for the transmission of telecommunication signals.

The raising of the transmission frequencies in these applications which have now reached several tens of GHz and their integration in CMOS or BiCMOS technologies in low consumption applications is giving rise to new constraints in the production of these amplifiers, in particular in terms of biasing and consumption.

SUMMARY

One embodiment proposes an RF amplifier circuit which wholly or party overcomes the disadvantages of the biasing and regulation methods.

One embodiment proposes a solution adapted to very high frequency applications, operating at several tens of GHz.

Thus, one embodiment provides a power supply and biasing stage of a radiofrequency amplifier of which an amplification stage comprises at least one MOS transistor whose control terminal is connected to an input terminal and of which a first conduction terminal is connected to an output terminal, in which a bias voltage of the control terminal of the transistor is controlled in such a way as to simultaneously regulate the power supply voltage of the amplification stage at a nominal value and the bias current of the amplification stage at a nominal value.

According to one embodiment, the power supply stage comprises a first amplifier for regulation of information representative of the voltage of the first conduction terminal of the transistor at a reference value, the output of the first amplifier providing the bias voltage.

According to one embodiment, the amplification stage also comprises a second amplifier for the regulation of information representative of the voltage of the first conduction terminal of the first transistor at the reference value and of the bias current at a reference current, the output of the second amplifier controlling a current source (N51) supplying the bias current.

According to one embodiment, all or some of the transistors are MOS transistors.

According to one embodiment, all or some of the transistors are bipolar transistors.

According to one embodiment, the reference current is provided by a current source of fixed value.

One embodiment provides an RF amplifier comprising an amplification state and a power supply and biasing stage.

One embodiment provides an electronic circuit integrating at least one RF amplifier.

BRIEF DESCRIPTION OF THE DRAWINGS

These features and advantages, as well as others, will be described in detail in the following description of particular embodiments given in a non-limiting way with reference to the appended drawings in which.

DETAILED DESCRIPTION OF ILLUSTRATIVE EMBODIMENTS

Same elements have been denoted by same references in the different figures. For the sake of clarity, only the elements useful for the understanding of the embodiments which are going to be described have been shown and will be described in detail. In particular, the circuits upstream and downstream of the RF amplifier and of its biasing circuit have not been shown in detail, the described embodiments being compatible with the circuits usually connected to an RF amplifier. Moreover, neither have the various possible applications of an RF amplifier been described in detail, the described embodiments here again being compatibles with the usual applications. In the following description, the expressions "approximately", "about" and "of the order of" signify to within 10%, preferably to within 5%.

It should be noted that, in the figures, the structural and/or functional elements common to the different embodiments can have the same references and can have identical structural, dimensional and hardware properties.

Figure 1:
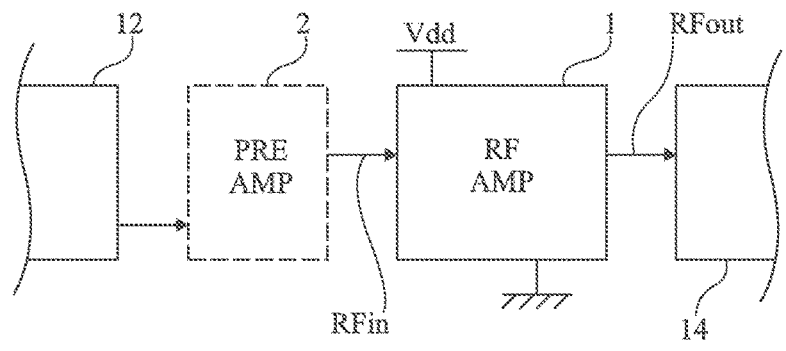
FIG. 1 is a simplified block diagram of an example of integration of an RF amplifier in its application environment.

FIG. 1 is a block diagram of an example of integration of an RF amplifier in its application environment.

An RF amplifier 1 (RF AMP) has the function of amplifying a radiofrequency signal RFin which it receives in order to produce a radiofrequency signal RFout.

The signal RFin can come from various upstream sources or circuits 12 depending on the applications. If necessary, a preamplifier 2 (PRE AMP) is interposed between the circuit 12 providing the signal to be amplified and the amplifier 1. Similarly, the signal RFout is intended for various downstream functions or circuits 14 depending on the applications.

For example, in the case of a radiofrequency transmission-reception system, which represents an application more particularly referred to by the present description, the upstream circuits can be the circuits for the generation (shaping, modulation, etc.) of the signals to be transmitted, and the RF amplifier represents the power amplifier of the transmission system, its output being sent to a transmitting antenna, via an antenna coupler. On reception, the RF amplifier represents the low noise amplifier (LNA) of the reception system and receives signals coming from an antenna to be sent to processing circuits (demodulation, interpretation, etc.).

The regulation of the power supply voltage and of the quiescent current of the RF amplifier influence its performance.

Circuits are known which use a power supply voltage regulator and a bias reference circuit imposing a chosen quiescent current. Such circuits suffer from imprecision between the voltage and current commands and the effective rest point of the amplifier.

Other techniques aim at measuring the effective quiescent current of the amplifier in order to regulate it. However, these techniques introduce a voltage drop which reduces the voltage available for the amplifier and, moreover, give rise to a continuous dissipation in the measuring element.

The biasing of the amplifier is the key to good amplification of the radiofrequency signal. In fact, the biasing must not only be accurate but must also be stable. However, various sources of interference arise in the circuit due to its biasing, such as, for example, matching defects of the transistors in static and dynamic conditions, noise introduced by the biasing, the power supply, etc.

An additional constraint in the applications referred to by the present description is the consumption. In fact, it is possible to design various compensation circuits in order to solve the problems related to biasing, but at the cost of high consumption. However, in applications such as mobile telephony and at the present time, the general reduction of consumption is a strong requirement. This becomes particularly critical with the existing solutions for frequencies of several GHz, for example, of the order of 60 GHz or more.

All of these solutions suffer from disadvantages either with regard to consumption or with regard to the noise introduced on the biasing signals, or with regard to the accuracy of the bias levels and their temperature stability and with regard to variations of the power supply voltage. Moreover, their use, in order to be effective, would require area ratios of the transistors which would be incompatible with present day requirements in terms of consumption.

Figure 2:
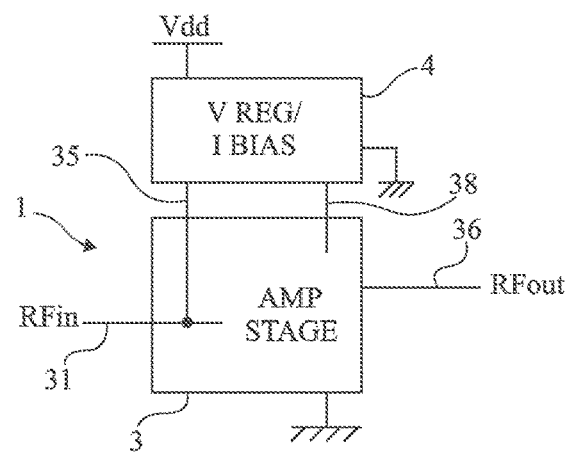
FIG. 2 is a simplified block diagram of an embodiment of an RF amplifier with regulated voltage and current.

FIG. 2 is a simplified block diagram of an embodiment of an RF amplifier.

The RF amplifier 1 comprises two circuits or stages having separate functions. A circuit or stage 3 for the amplification itself (AMP STAGE) receives the signal RFin on a terminal 31 and supplies the signal RFout on a terminal 36. A circuit or stage 4 for regulation of the power supply voltage and bias current (V REG/I BIAS) has the function of powering and biasing the amplification stage. The two stages are interconnected, the power supply voltage Vbias being applied to a terminal 35 of the stage 3 and the current Ibias being applied to a terminal 38 of the stage 3.

Figure 3:
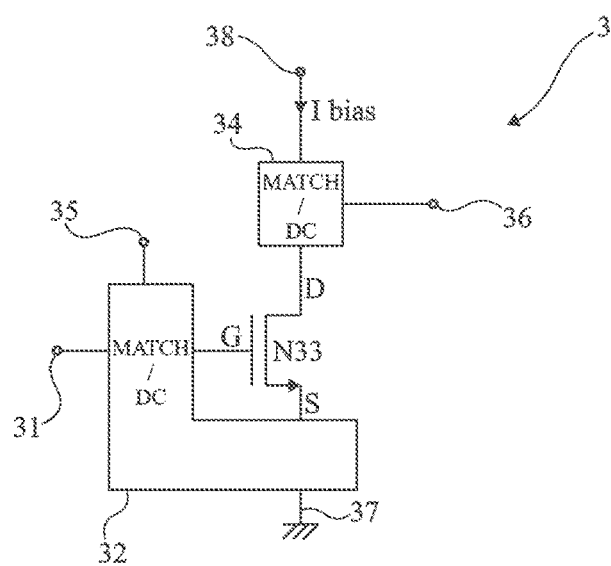
FIG. 3 shows, in a very diagrammatic manner and in the form of blocks, an embodiment of an amplification stage of an RF amplifier.

FIG. 3 shows, in a very diagrammatic way and in the form of blocks, an embodiment of an amplification stage 3 of an RF amplifier 1.

The example of a stage based on an N-channel MOS transistor is considered. However, everything that will be described hereafter applies more generally to any structure of amplification transistors (for example, several transistors in series, cascode connection, etc.).

Stage 3 comprises an input terminal 31, intended to receive the signal RFin, connected by the intermediary of an impedance matching and DC supply network (MATCH/DC) to the gate G (control terminal) of at least one MOS transistor (for example, an N-channel transistor) N33. The network 32 also comprises a terminal 35 for the application of a regulated DC supply voltage Vbias, supplied by the stage 4 (FIG. 2). The network 32 optionally connects the source S (conduction terminal) of the transistor N33 to an earth terminal 37, for example, directly in the case of a common source stage. The drain D (conduction terminal) of the transistor N33 is connected, also through an impedance matching and DC supply network 34 (MATCH/DC), to an output terminal 36 intended to supply the signal RFout and to a power supply terminal 37, intended to be connected to the stage 4. The networks 32 and 34 can be of various types and comprise passive components, transmission lines, transformers, etc.

The function of the network 32 is to apply a DC voltage to the gate G of the transistor N33 and to match the input impedance of the amplification stage to that of the RF source connected to the terminal 31 in order to transmit the signal RFin to the gate. The function of the network 34 is to supply the transistor N33 with a DC voltage and to match the output impedance of the amplification to that of a load connected to the terminal 36 in order to transmit the signal RFout.

The embodiments described hereafter provide for regulating the point of rest of the amplifier, that is to say both the drain current and voltage of the transistor. This regulation is carried out at least on the DC component of the gate voltage of the transistor N33 as a function of the possible variations of the current and of the drain voltage of that transistor. This makes it possible to maintain a point of rest which is stable and independent of possible variations of the power supply voltage of the amplifier and other static and dynamic factors, without bringing about voltage drop or additional dissipation in comparison with devices regulating only the power supply voltage.

In all of the figures hereafter, the amplification stage 3 (AMP STAGE) is symbolised in the form of a block having five terminals: the input terminal 31 for the signal RFin; the output terminal 36 for the signal RFout; the terminal 35 for application of the regulated DC bias voltage Vbias; the terminal 38 for the supply Ibias; and the terminal 37 connected, for example, to earth.

Moreover, the described embodiments use, for example, a positive power supply Vdd. However, more generally, the terminals 38 and 37 are terminals for the application of the power supply voltage of the amplification stage.

Figure 4:
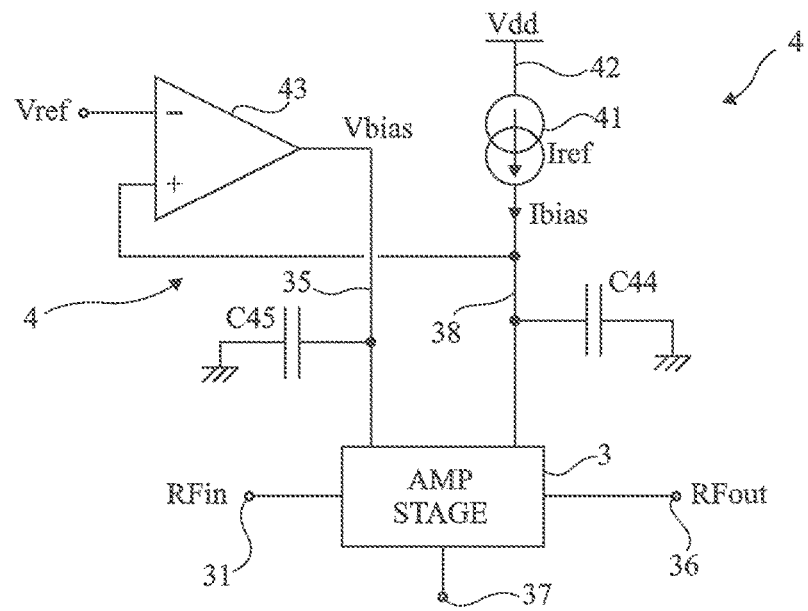
FIG. 4 shows an electric circuit diagram of an embodiment of a power supply and biasing stage of an RF amplifier.

FIG. 4 shows an electric circuit diagram of an embodiment of a power supply and biasing stage of an RF amplifier.

In this case stage 4 is constituted by a current source 41 of fixed value Iref, interposed between a terminal 42 for application of a DC power supply voltage Vdd (a power supply voltage available in the electronic circuit in which the RF amplifier is integrated) and the terminal 38. The value of the nominal current Iref, supplied by the source 41, and its variation with temperature, are fixed when designing the amplifier as a function of the desired operational characteristics and must be independent of the variations of the power supply voltage Vdd.

Stage 4 of FIG. 4 also comprises an amplifier 43 for regulation of the voltage of the terminal 38 at a reference voltage Vref. For example, the terminal 38 is connected to the non-inverting input of the amplifier 43 while the reference voltage Vref is applied to its inverting input. The output of the amplifier 43 provides a gate bias voltage Vbias as a function of the variations of the bias current Ibias. The value of the reference voltage Vref is fixed, during the design of the circuit, as a function of the desired nominal operational characteristics of the RF amplifier. The obtaining of reference voltages stable with temperature and with possible variations of the power supply voltage does not raise any problems.

In practice, a capacitor C44 connects the terminal 38 to ground in order to filter/stabilize the voltage of the terminal 38 taken as a measurement by the amplifier 43 and supplying the radiofrequency amplifier, limiting the impact of the noise introduced by the power supply Vdd and the current source Iref. Moreover, a capacitor C45 connects the output of the amplifier 43 to earth in order to filter/stabilize this output. The capacitor C45 notably makes it possible to reduce the noise likely to the introduced on the bias voltage Vbias by the amplifier 43 by filtering this noise to earth. Consequently, the radiofrequency operation is not interfered with.

Moreover, with regard to the biasing of the gate of the amplification transistor (N33, FIG. 3), an advantage of the described solution with respect to a solution in which the gate voltage would be fixed by a transistor connected as a diode in order to obtain a current mirror between the gate and earth is that the static error due to the mismatch between the transistors is avoided.

Figure 5:
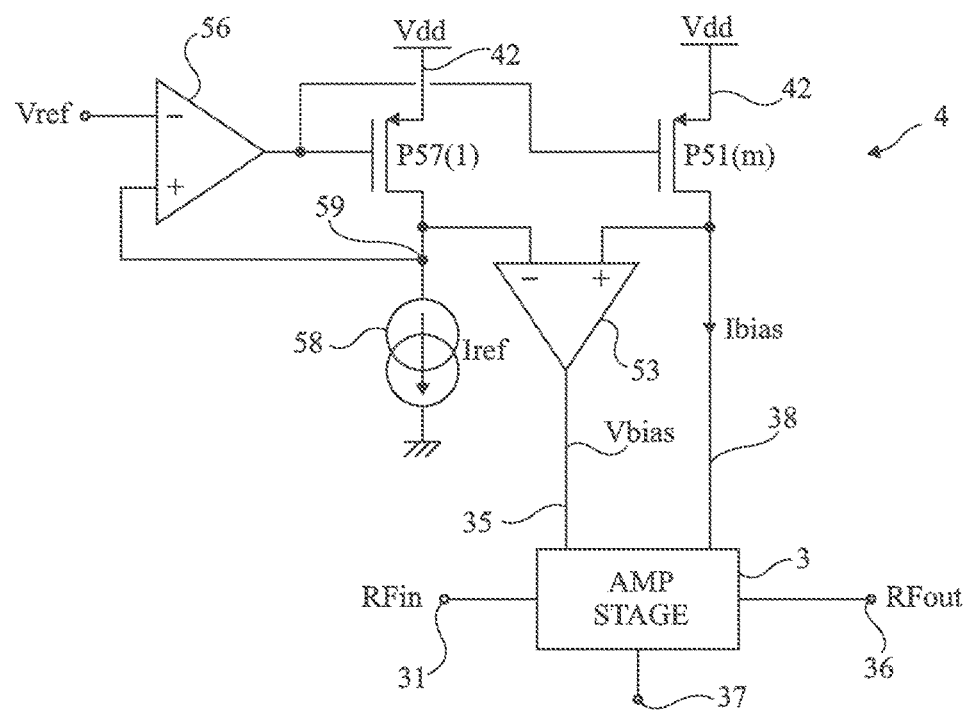
FIG. 5 shows an electric circuit diagram of another embodiment of a power supply and biasing stage of an RF amplifier.

FIG. 5 shows an electric circuit diagram of another embodiment of a stage 4 for the power supply and biasing of an RF amplifier.

In this case, the bias current source is formed by a P-channel MOS transistor, P51, connected between the terminals 42 and 38, and controlled by an amplifier 56 regulating the gate voltage of the transistor P51 from a reference branch. This reference branch comprises, in series between the terminal 42 and earth, a P-channel transistor, P57, and a current source 58 of fixed value Iref. The mid-point 59 between the transistor P57 and the current source 58 is connected to the input (for example, non-inverting) of the amplifier 56, its inverting input receiving the reference voltage Vref. The output of the amplifier 56 is connected to the gates of the transistors P51 and P57. The transistor P57 is smaller (1) than the transistor P51 (m). Preferably, the transistor P51 is produced in the form of several transistors in parallel, each one the same size as the transistor P57, in order to obtain a good matching of the transistors. The transistors P51 and P57 are thus matched with a known multiplication factor m. In fact, the transistor P57 serves to replicate possible variations of the same nature as those undergone by the transistor P51 in order to allow the adjustment of the current Ibias supplied by the transistor P51, which is thus a known multiple (m) of the current Iref. Thus, the additional cost in terms of consumption brought about by the regulation of the current Ibias is minimized.

The bias voltage Vbias is supplied by an amplifier 53 whose inputs (for example, non-inverting and inverting respectively) are connected to the terminals 38 and 59. The output of the amplifier 53 is connected to the gate of the transistor N33. In other words, the amplifier 53 regulates the voltage Vbias in such a way that the voltage of the terminal 38 (the drain voltage of the transistor N33) is regulated at the value of the voltage Vref. Capacitors C44 and C45, which are not shown, are also preferably provided.

The value of the reference voltage Vref is fixed, during the design of the circuit, as a function of the nominal operational characteristics desired for the RF amplifier. In comparison with the embodiment shown in FIG. 4, it is noted that the current source 58 is on the earth side, which facilitates it production.

An advantage of the described embodiments is that the transistor N33 itself participates in the regulation of the bias current and voltage. This reduces the consumption of this regulation in comparison with usual methods. Moreover, this reduces the interference brought about by this regulation.

Another advantage of the described embodiments is that the functions usually carried out by a power supply voltage regulator (LDO) and by a biasing circuit (fixing the voltage Vbias) are simultaneously provided without additional consumption and with better accuracy of the quiescent current.

Figure 6:
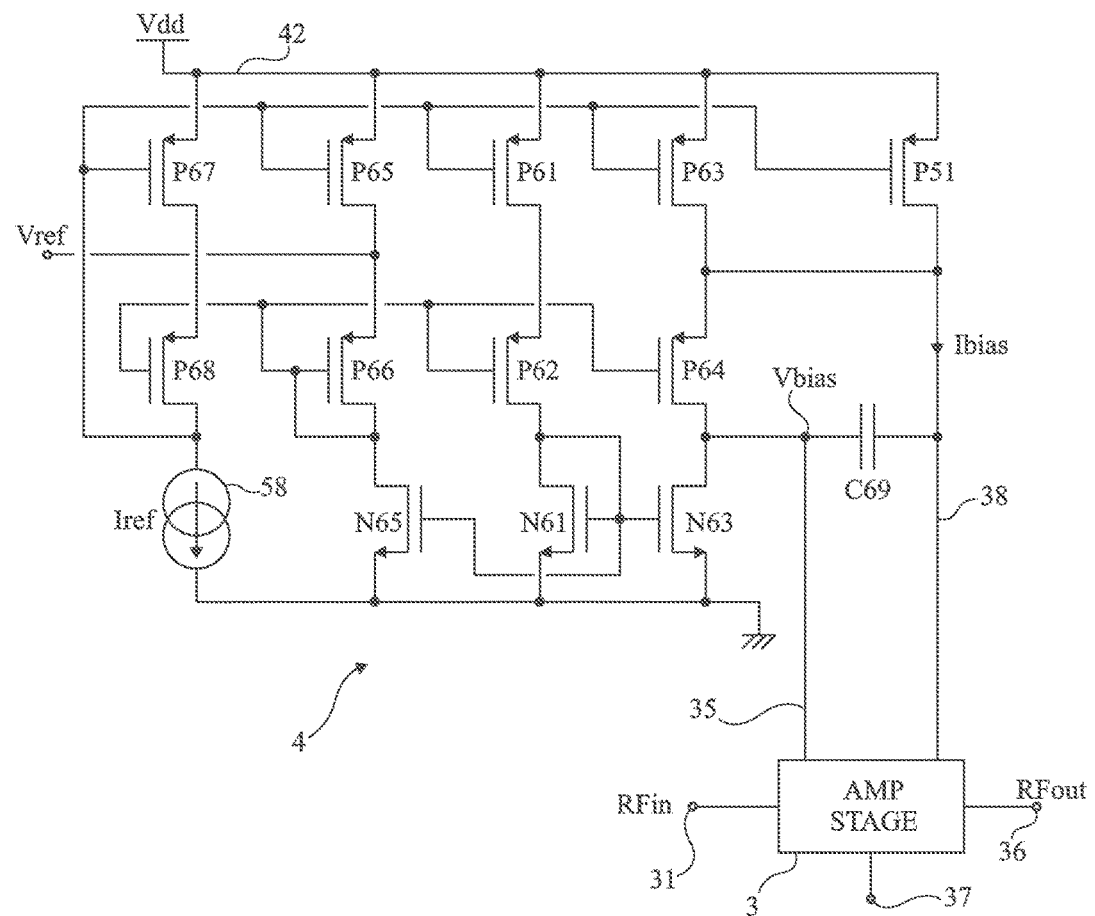
FIG. 6 is more detailed electric circuit diagram of a practical example of embodiment of the embodiment shown in FIG. 5.

FIG. 6 is a more detailed electric circuit diagram of an example of a practical embodiment of the embodiment shown in FIG. 5.

The branch containing the transistor P51 is identical to the one shown in FIG. 5.

According to this embodiment, there is provided, in the power supply and biasing stage 4, four branches of transistors in parallel with the branch including the transistor N51 in order to carry out the functions of the feedback amplifiers 53 and 56. These four branches respectively comprise, in series between the terminal 42 and earth: two P-channel MOS transistors P63 and P64 and one N-channel MOS transistor N63; two P-channel MOS transistors P61 and P62 and one N-channel MOS transistor N61, the transistor N61 having its gate and drain interconnected; two P-channel MOS transistors P65 and P66 and one N-channel MOS transistor N65, the transistor P66 having its gate and drain interconnected; two P-channel MOS transistors P67 and P68 and the fixed current Iref source 58.

The gates of the transistors P62, P64, P66 and P68 are connected together, and therefore to the drain of the transistor N65. The gates of the transistors P51, P61, P63, P65 and P67 are connected to the node between the transistor P68 and the current source 58. The gates of the transistors N61 and N65 are connected together to the gate of the transistor N63. The drains of the transistors P51 and P63 are interconnected. The common drain of the transistors N63 and P64 supply the voltage Vbias and is connected, through a capacitor C69, to the node 38. The voltage Vref is applied to the common node between the transistors P65 and P66 (drain of the transistor P65 and source of the transistor P66).

The transistors shown on a same line are matched, the transistor P51 being of size multiplied by an integer factor m with respect to the transistors P67, P65, P61, P63 in order to generate a current Ibias=m*Iref. The function carried out by the amplifier 53 shown in FIG. 5 is provided by the common gate transistor P64, which regulates the voltage Vbias as a function of the potential present on the terminal 38. This is stabilized at the voltage Vref because the gate potential common to the transistors P64, P62, P66 and P68 is generated by the transistor P66 whose source is at the voltage Vref and the drain-source current is identical to that of the transistor P64 thanks to the transistors N65 and N63 which are matched. When this condition of equilibrium is reached, the potentials around the transistor P51 being equal to those of the sources of the transistors P61, P63, P65 and P67, the current which passes through the transistor P51 is Ibias=m*Iref which is thus imposed on the RF amplifier.

The branch including the transistors P67 and P68 serves to copy the reference current Iref and therefore fulfils the function of the amplifier 56 and of the transistor P57 shown in FIG. 5.

One advantage of the embodiment shown in FIG. 6 is, on the one hand, that it makes all of the drain-source voltage drops identical and, on the other hand, that it makes all of the gate-source voltages of the transistors of the four branches identical. Thus, the systematic matching errors between the static currents are eliminated, even with a low voltage drop available for the transistor P51, which maximizes the voltage used for the RF amplifier and minimizes the power dissipated in the transistor P51.

Figure 7:
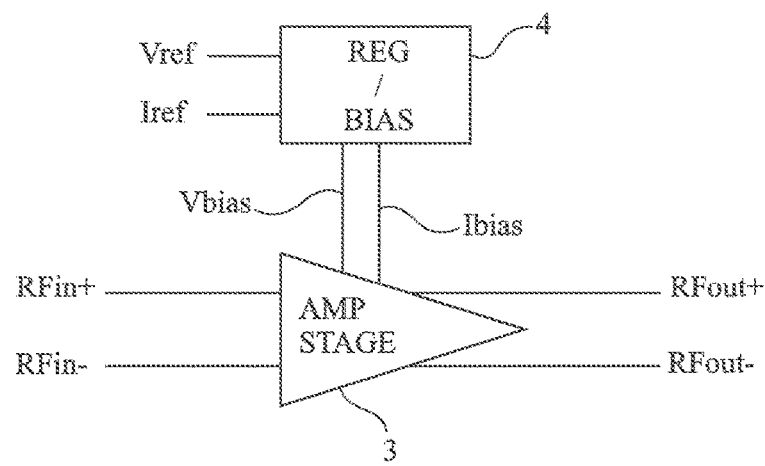
FIG. 7 shows, in a simplified manner and in the form of blocks, the application of a power supply and biasing stage (REG/BIAS) to a differential RF amplifier.

FIG. 7 shows, in a simplified way and in the form of blocks, the application of the power supply and bias stage 4 (REG/BIAS) to a differential RF amplifier.

In comparison with the previous embodiments, the amplification stage 3 comprises two inputs RFin+ and RFin− for receiving the differential signal to be amplified and two outputs RFout+ and RFout− providing the amplified differential signal. The functioning of the circuit shown in FIG. 7 is deduced from that of the preceding figures.

Figure 8:
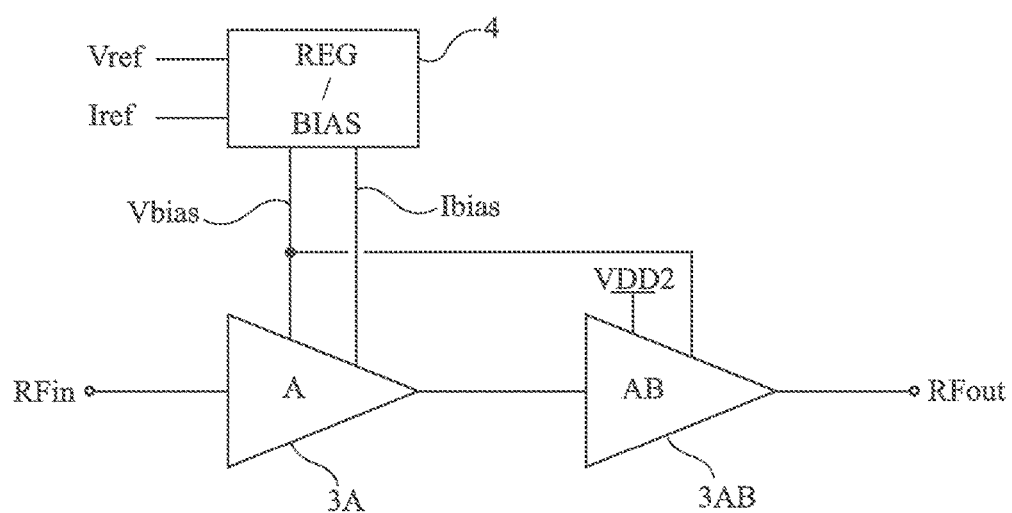
FIG. 8 shows another embodiment of an RF amplifier in a simplified and manner and partially in form of blocks.

FIG. 8 shows another embodiment of an RF amplifier in a simplified way and partially in the form of blocks.

This embodiment takes advantage of the existence of a class A RF preamplifier 3A upstream of a class AB RF amplifier 3AB.

The signal RFin to be amplified is applied to the amplifier or preamplifier 3A, whose RF output is connected to the RF input of the amplifier 3AB, whose output provides the signal RFout.

With regard to the power supply and bias, the voltage Vbias and the current Ibias are supplied to the preamplifier 3A while only the voltage Vbias is supplied to the amplifier 3AB which is moreover powered by a voltage VDD2. The functioning of the circuit shown in FIG. 8 is deduced from the functioning of the preceding figures.

One advantage of the embodiments described above is that they provide a reliable way of producing a very high frequency RF amplifier which is stable and independent of temperature and supply voltage variations and which also provides a bias level with is not interfered with.

Another advantage of the described embodiments is that the consumption of the biasing stage is reduced with respect to the existing methods.

Various embodiments and variants have been described. These variants and embodiments can be combined. Various other variants and modifications will be apparent to those skilled in the art. In particular, the choice of the embodiment and the sizing of the components depend on the application and on the appended circuits available in the circuit in which the RF amplifier is integrated. Moreover, although the above description refers to an embodiment in the form of MOS transistors, the described embodiments transpose without difficulty to an embodiment based on bipolar transistors or MOS and bipolar transistors. Moreover, the practical implementation of the embodiments that have been described is within the capabilities of those skilled in the art on the basis of the functional indications given above.

What is claimed is:

1. A radio frequency (RF) amplifier comprising:
an input terminal;
an output terminal;
a power supply and biasing stage comprising a first amplifier having an output coupled to the input terminal, and a second amplifier having an output coupled to a current source; and
an amplification stage comprising a first transistor having a control terminal coupled to the input terminal and a first conduction terminal coupled to the output terminal, wherein the power supply and biasing stage is configured to generate a bias voltage at the control terminal of the first transistor to simultaneously regulate a power supply voltage of the amplification stage to a first voltage and a bias current of the amplification stage to a first current, wherein the first amplifier is configured to regulate the first conduction terminal of the first transistor to the first voltage, the first amplifier configured to provide, at the output of the first amplifier, the bias voltage, wherein the second amplifier is configured to regulate the bias current to the first current.

2. The RF amplifier of claim 1, wherein the amplification stage is configured to generate the bias voltage based on variations of the bias current.

3. A radio frequency (RF) amplifier comprising:
an input terminal;
an output terminal;
a power supply and biasing stage having an output coupled to the input terminal; and
an amplification stage comprising a first transistor having a control terminal coupled to the input terminal and a first conduction terminal coupled to the output terminal, wherein the power supply and biasing stage is configured to generate a bias voltage at the control terminal of the first transistor to simultaneously regulate a power supply voltage of the amplification stage to a first voltage and a bias current of the amplification stage to a first current, wherein the power supply and biasing stage comprises a first amplifier having an output coupled to a current source, the first amplifier configured to regulate the bias current to the first current, and wherein the first current is a fixed current.

4. The RF amplifier of claim 1, wherein the current source comprises a second transistor coupled to a supply terminal and having a gate coupled to the output of the second amplifier.

5. The RF amplifier of claim 4, wherein the first and second transistors are MOS transistors.

6. The RF amplifier of claim 4, wherein the first and second transistors are bipolar transistors.

7. A circuit comprising:
a radio frequency (RF) amplification stage comprising a first transistor having a gate configured to receive a RF signal; and
a power supply and biasing stage comprising:
a first current source configured to generate a bias current and coupled to a first conduction terminal of the first transistor, and
a first amplifier having
a first input coupled to the first conduction terminal of the first transistor,
a second input coupled to a first reference voltage node, the first reference voltage node configured to receive a first reference voltage,
an output coupled to the gate of the first transistor, the first amplifier configured to generate a bias voltage at the output of the first amplifier and to apply the bias voltage to the gate of the first transistor,
a second transistor coupled between a first supply terminal and the second input of the first amplifier,
a second amplifier having an output coupled to a gate of the second transistor, the second amplifier configured to regulate the second input of the first amplifier to the first reference voltage, and
a second current source coupled between the second transistor and a second supply terminal, wherein the first current source comprises a third transistor coupled between the first supply terminal and the first input of the first amplifier, the third transistor having a gate coupled to the output of the second amplifier.

8. The circuit of claim 7, wherein the first amplifier is configured to regulate the first conduction terminal of the first transistor to the first reference voltage.

9. The circuit of claim 8, wherein the first amplifier is configured to generate the bias voltage at the gate of the first transistor as a function of the bias current.

10. A circuit comprising:
a radio frequency (RF) amplification stage comprising a first transistor having a gate configured to receive a RF signal; and
a power supply and biasing stage comprising:
  a first current source configured to generate a bias current and coupled to a first conduction terminal of the first transistor,
  a first amplifier having
    a first input coupled to the first conduction terminal of the first transistor,
    a second input coupled to a first reference voltage node, the first reference voltage node configured to receive a first reference voltage, and
    an output coupled to the gate of the first transistor,
  a first capacitor coupled between the first conduction terminal of the first transistor and a second supply terminal,
  a second capacitor coupled between the output of the first amplifier and the second supply terminal,
  a second transistor coupled between a first supply terminal and the second input of the first amplifier,
  a second amplifier having an output coupled to a gate of the second transistor, the second amplifier configured to regulate the second input of the first amplifier to the first reference voltage, and
  a second current source coupled between the second transistor and a second supply terminal, wherein the first current source comprises a third transistor coupled between the first supply terminal and the first input of the first amplifier, the third transistor having a gate coupled to the output of the second amplifier.

11. The circuit of claim 7, wherein the second supply terminal is coupled to ground.

12. A circuit comprising:
a radio frequency (RF) amplification stage comprising a first transistor having a gate configured to receive a RF signal; and
a power supply and biasing stage comprising:
  a second transistor coupled to a first supply terminal,
  a first current source configured to generate a bias current and coupled to a first conduction terminal of the first transistor the first current source comprising a third transistor coupled between the first supply terminal and the first conduction terminal of the first transistor, the third transistor having a gate coupled to a gate of the second transistor,
  a second current source coupled between the second transistor and a second supply terminal,
  a fourth transistor having a first conduction terminal coupled to a first conduction terminal of the second transistor, and a second conduction terminal coupled to a gate of the second transistor, and
  a fifth transistor having a first conduction terminal coupled to the gate of the first transistor, a second conduction terminal coupled to the first conduction terminal of the first transistor, and a gate coupled to a gate of the fourth transistor, the gate of the fifth transistor further coupled to a first reference voltage node.

13. The circuit of claim 12, wherein the power supply and biasing stage further comprises:
  a sixth transistor coupled between the first supply terminal and a second conduction terminal of the fifth transistor, the sixth transistor having a gate coupled to the gate of the third transistor;
  a seventh transistor coupled between the second supply terminal and the first conduction terminal of the fifth transistor; and
  a first capacitor coupled between the first conduction terminal of the fifth transistor and the third transistor.

14. The circuit of claim 13, wherein:
the first and seventh transistors are N-channel transistors; and
the second, third, fourth, fifth, and sixth transistors are P-channel transistors.

15. A method comprising:
receiving a radio frequency (RF) input signal at an input of a RF amplification stage comprising a first transistor having a gate coupled to the input of the RF amplification stage, and a first conduction terminal coupled to an output of the RF amplification stage;
providing a bias current to the first conduction terminal of the first transistor;
receiving a reference voltage at a first input of a first amplifier;
regulating a voltage of the first conduction terminal of the first transistor based on the reference voltage;
generating a bias voltage at an output of the first amplifier, the first amplifier having a second input coupled to the first conduction terminal of the first transistor;
providing the bias voltage to the gate of the first transistor; and
generating a RF output signal at the output of the RF amplification stage based on the RF input signal, wherein providing the bias current to the first conduction terminal of the first transistor comprises controlling a gate of a second transistor coupled between a first supply terminal and the first conduction terminal of the first transistor with an output of a second amplifier having a first input receiving a second reference voltage and a second input coupled to a first conduction terminal of a third transistor, the third transistor having a gate coupled to the gate of the second transistor, wherein the reference voltage is based on the second reference voltage.

16. The method of claim 15, wherein providing the bias voltage to the gate of the first transistor comprises providing the bias voltage to the gate of the first transistor based on the bias current.

17. The method of claim 15, further comprising generating the bias current based on a first current, wherein the first current is a fixed current.

18. The circuit of claim 7, wherein the second current source is configured to generate a first current, wherein the second amplifier is configured to regulate the bias current based on the first current, and wherein the first current is a fixed current.

19. The circuit of claim 13, wherein the power supply and biasing stage further comprises:
an eight transistor having a gate coupled to the gate of the fifth transistor, a first conduction terminal coupled to the gate of the eight transistor, and a second conduction terminal coupled to the first reference voltage node; and ninth transistor coupled between the first supply terminal and the first reference voltage node, and having a gate coupled to the gate of the second transistor.

20. The RF amplifier of claim 1, wherein the amplification stage comprises differential inputs configured to receive a differential signal.

21. The RF amplifier of claim 1, wherein the first transistor is an N-channel metal-oxide semiconductor (NMOS) transistor.

22. The RF amplifier of claim 1, wherein the amplification stage comprises an impedance matching and DC supply network coupled between the input terminal and the control terminal of the first transistor.

* * * * *